United States Patent
Lin et al.

(10) Patent No.: US 9,484,312 B2
(45) Date of Patent: Nov. 1, 2016

(54) INDUCTOR SHIELDING STRUCTURE, INTEGRATED CIRCUIT INCLUDING THE SAME AND METHOD OF FORMING THE INTEGRATED CIRCUIT

(71) Applicant: TAIWAN SEMICONDUCTOR MANUFACTURING COMPANY, LTD., Hsinchu (TW)

(72) Inventors: Chi-Hsien Lin, Taichung (TW);
Hsien-Yuan Liao, Hsinchu (TW);
Ying-Ta Lu, Hsinchu (TW);
Ho-Hsiang Chen, Hsinchu (TW);
Tzu-Jin Yeh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/600,634

(22) Filed: Jan. 20, 2015

(65) Prior Publication Data
US 2016/0211220 A1 Jul. 21, 2016

(51) Int. Cl.
*H01L 23/52* (2006.01)
*H01L 23/552* (2006.01)
*H01L 49/02* (2006.01)
*H01L 23/522* (2006.01)

(52) U.S. Cl.
CPC ............ *H01L 23/552* (2013.01); *H01L 28/10* (2013.01); *H01L 23/5227* (2013.01)

(58) Field of Classification Search
None
See application file for complete search history.

(56) References Cited

U.S. PATENT DOCUMENTS

| | | | |
|---|---|---|---|
| 6,452,249 B1 * | 9/2002 | Maeda | H01L 21/28518 257/347 |
| 8,279,008 B2 | 10/2012 | Hsieh et al. | |
| 8,427,240 B2 | 4/2013 | Hsieh et al. | |
| 8,492,872 B2 * | 7/2013 | Yang | H01L 23/5225 257/528 |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,659,126 B2 * | 2/2014 | Lin | H01L 23/5225 257/531 |
| 8,809,956 B2 * | 8/2014 | Cho | H01L 23/5223 257/351 |
| 2004/0119574 A1 * | 6/2004 | Lee | H01F 17/0013 336/200 |
| 2012/0092230 A1 | 4/2012 | Hung et al. | |
| 2013/0234305 A1 | 9/2013 | Lin et al. | |
| 2013/0278372 A1 * | 10/2013 | Stecher | H01L 23/5227 336/200 |
| 2014/0042612 A1 * | 2/2014 | Liu | H01L 23/5226 257/734 |
| 2014/0132333 A1 | 5/2014 | Jin et al. | |
| 2014/0217546 A1 | 8/2014 | Yen et al. | |
| 2014/0253262 A1 | 9/2014 | Hsieh et al. | |
| 2014/0253391 A1 | 9/2014 | Yen | |
| 2015/0214148 A1 * | 7/2015 | Tsai | H01L 23/5225 438/381 |

\* cited by examiner

*Primary Examiner* — Nicholas Tobergte
(74) *Attorney, Agent, or Firm* — Hauptman Ham, LLP

(57) ABSTRACT

An inductor shielding structure includes a first conductive layer including a plurality of first conductive lines having a first width and a plurality of second conductive lines having a second width. The inductor shielding structure further includes a second conductive layer over the first conductive layer. The second conductive layer includes at least one third conductive line having a third width and a plurality of fourth conductive lines having a fourth width. Each conductive line of the at least one third conductive line is parallel to each conductive line of the plurality of first conductive lines. Each conductive line of the plurality of fourth conductive lines is parallel to each conductive line of the plurality of second conductive lines. The first width is different from the second width, or the third width is different from the fourth width.

20 Claims, 7 Drawing Sheets

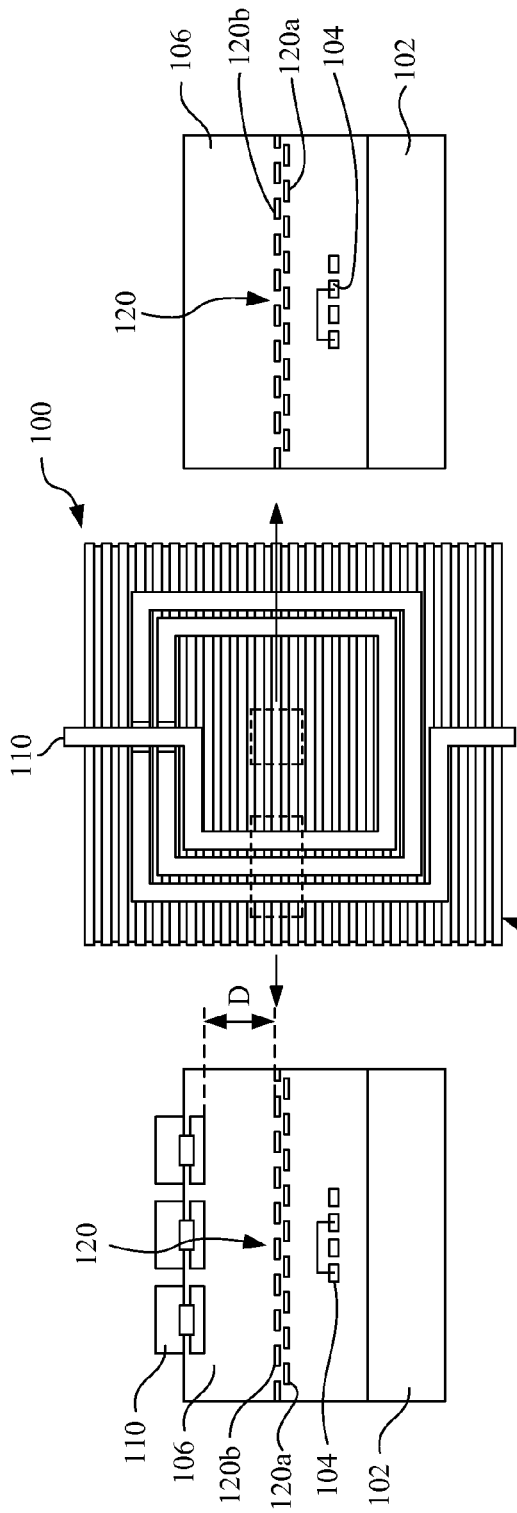
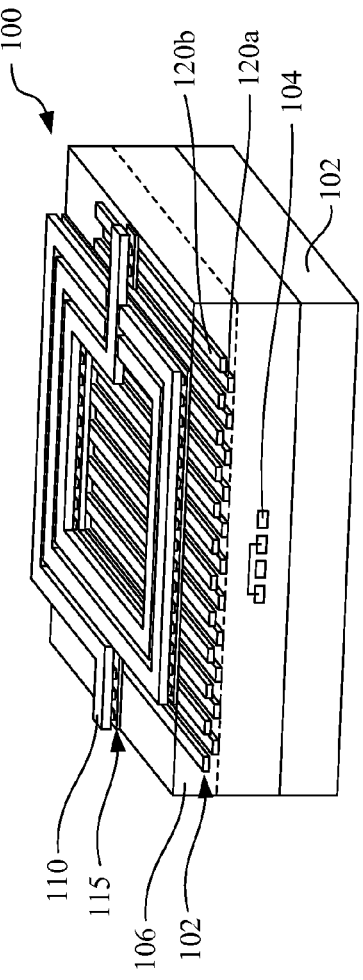

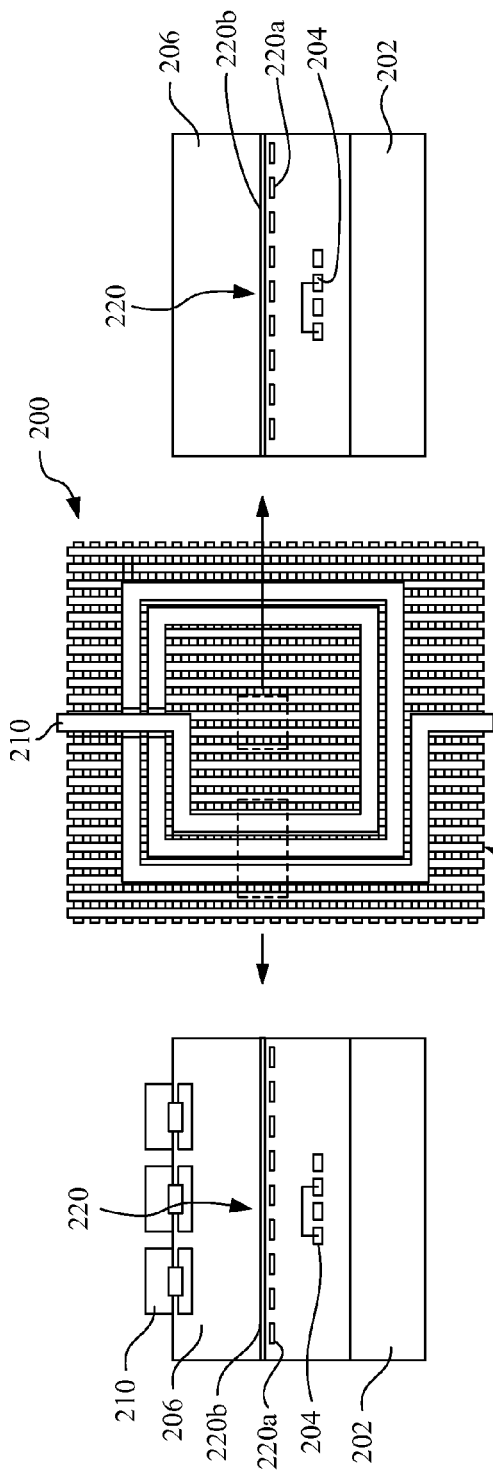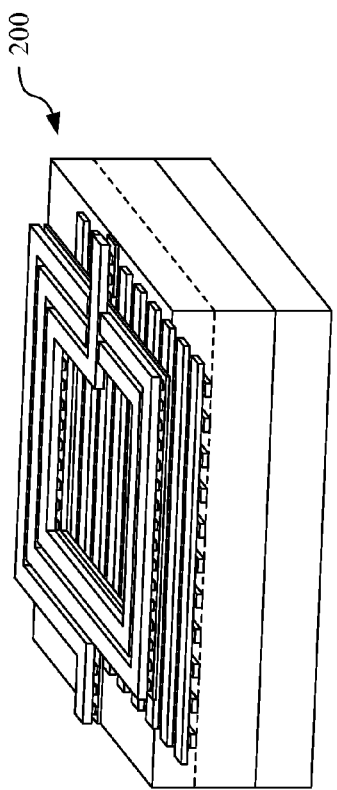
Fig. 2A
Fig. 2B
Fig. 2C
Fig. 2D

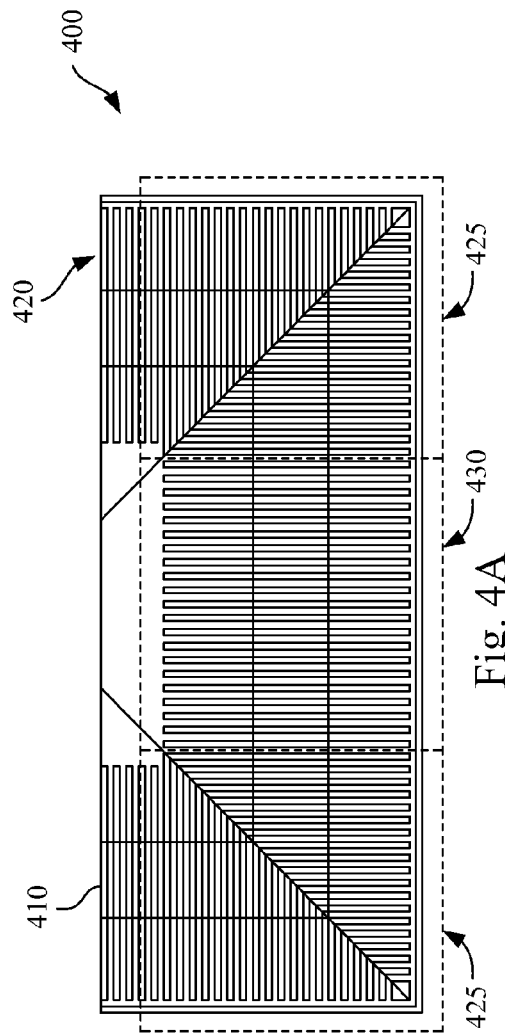
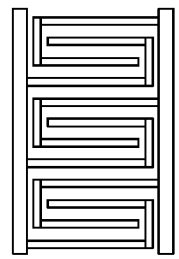
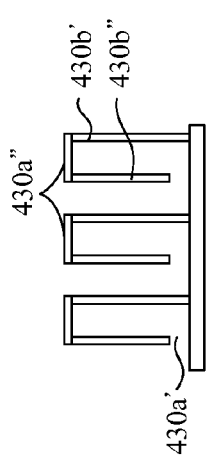
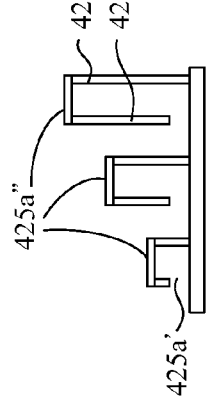
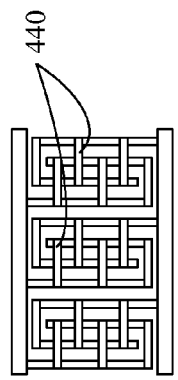

INDUCTOR SHIELDING STRUCTURE, INTEGRATED CIRCUIT INCLUDING THE SAME AND METHOD OF FORMING THE INTEGRATED CIRCUIT

BACKGROUND

Inductors are used in integrated circuits to help resist a change in current which could potentially damage components of an integrated circuit. In integrated circuits which include alternating current (AC) power, inductors are used to filter out high frequency signals. Passing a current through an inductor creates a magnetic field which is capable of impacting a performance of other components in the integrated circuit as a result of coupling between the inductor and the other components.

Inductors are generally large elements which occupy a significant amount of space in the integrated circuit. To reduce an impact of coupling, inductors are spaced away from other components, in some instances. This spacing increases an overall size of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top view of an integrated circuit including an inductor shielding structure in accordance with some embodiments.

FIG. 1B is a cross-sectional view of an integrated circuit including an inductor shielding structure in accordance with some embodiments.

FIG. 1C is a cross-sectional view of an integrated circuit including an inductor shielding structure in accordance with some embodiments.

FIG. 1D is a perspective view of an integrated circuit including an inductor shielding structure in accordance with some embodiments.

FIG. 2A is a top view of an integrated circuit including an inductor shielding structure in accordance with some embodiments.

FIG. 2B is a cross-sectional view of an integrated circuit including an inductor shielding structure in accordance with some embodiments.

FIG. 2C is a cross-sectional view of an integrated circuit including an inductor shielding structure in accordance with some embodiments.

FIG. 2D is a perspective view of an integrated circuit including an inductor shielding structure in accordance with some embodiments.

FIG. 4A is a top view of a portion of an integrated circuit including an inductor shielding structure in accordance with some embodiments.

FIG. 4B is a schematic view of a corner region of an inductor shielding structure in accordance with some embodiments.

FIGS. 4C-4E are schematic views of a straight region of an inductor shielding structure in accordance with some embodiments.

DETAILED DESCRIPTION

Figure 3:
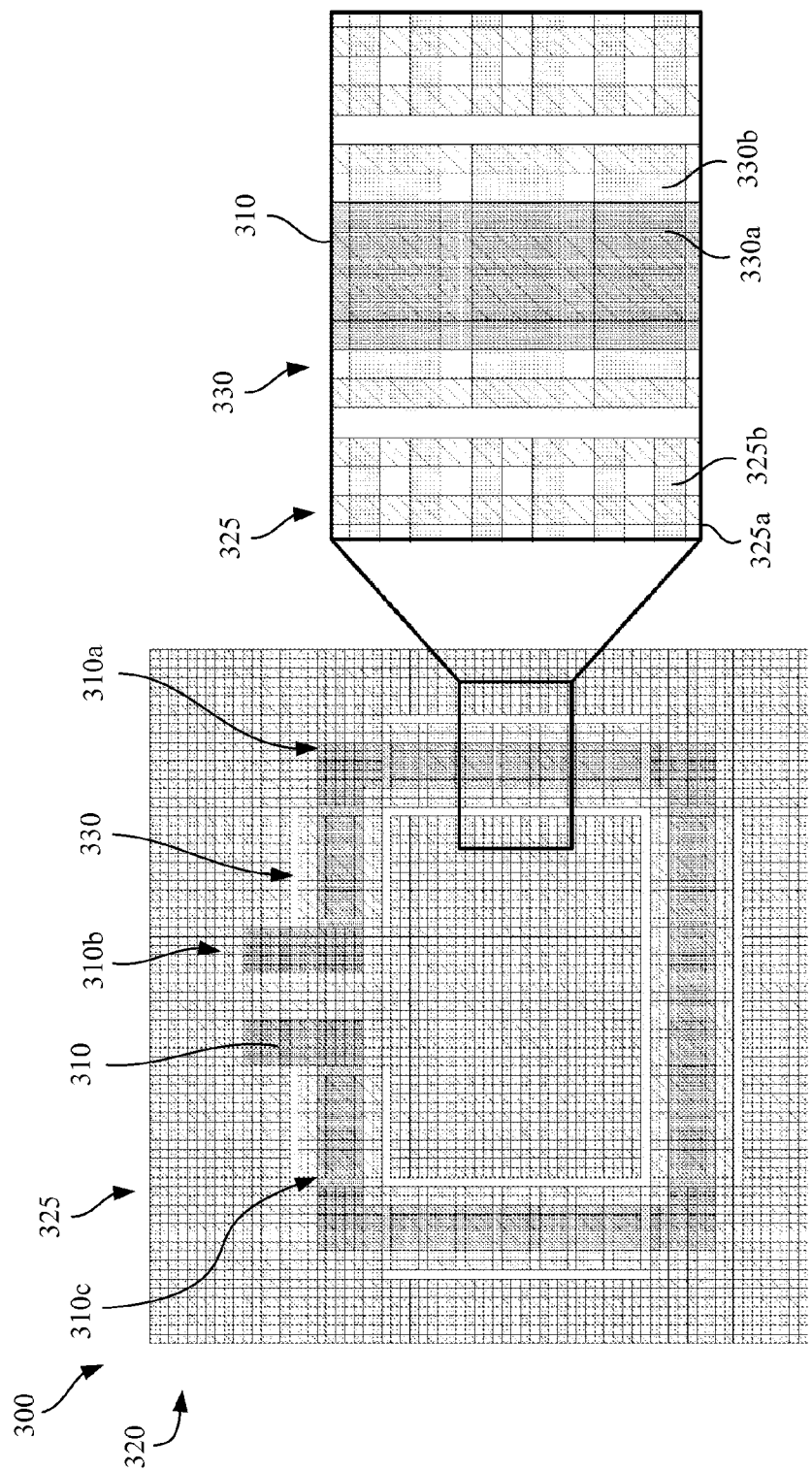
FIG. 3 is a top view of an integrated circuit including an inductor shielding structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a top view of an integrated circuit 100 including an inductor shielding structure in accordance with some embodiments. Integrated circuit 100 includes an inductor 110 over an inductor shielding structure 120. Inductor shielding structure 120 extends under conductive regions of inductor 110 as well as under a central region of the inductor.

Inductor 110 includes a conductive element configured to receive an input signal and output and output signal. In some embodiments, inductor 110 includes copper, aluminum, tungsten or another suitable conductive material. In some embodiments, inductor 110 is on a top layer of integrated circuit 100 farthest from a substrate 102 (FIG. 1B). In some embodiments, inductor 110 is on multiple layers of integrated circuit 100. Portions of inductor 110 on different layers of integrated circuit 100 are electrically connected by vias, line plugs, or other suitable connective elements. A line plug is a conductive element which is capable of both vertical routing between layers of the integrated circuit and routing within a plane of a layer of the integrated circuit.

Inductor shielding structure 120 is configured to reduce coupling between inductor 110 and circuitry within integrated circuit 100. Inductor shielding structure 120 includes conductive elements on multiple layers of integrated circuit 100. In some embodiments, inductor shielding structure includes copper, aluminum, tungsten, or another suitable conductive material. In some embodiments, conductive elements on the multiple layers of integrated circuit 100 are electrically connected together by vias, line plugs, or other connective elements. In some embodiments, inductor shielding structure 120 is connected to a reference voltage, e.g., a ground voltage. In some embodiments, inductor shielding structure 120 is electrically floating, i.e., electrically separated from a supply voltage.

FIG. 1B is a cross-sectional view of integrated circuit 100 including inductor shielding structure 120 in accordance with some embodiments. FIG. 1B is a cross-sectional view of integrated circuit including a conductive region of inductor 110. Integrated circuit 100 includes a substrate 102. Circuitry 104 is over substrate 102. Inductor shielding structure 120 is on an opposite side of circuitry 104 from substrate 102. Inductor shielding structure 120 includes a first conductive layer 120a and a second conductive layer 120b. First conductive layer 120a is closer to substrate 102 than second conductive layer 120b. First conductive layer 120a extends in a first direction parallel to a top surface of substrate 102. Second conductive layer 120b also extends in the first direction. A dielectric layer 106 is over inductor shielding layer 120. Inductor 110 is over dielectric layer 106.

In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Circuitry 104 includes at least one conductive element. In some embodiments, circuitry 104 includes active circuitry, such as transistors, pass gates, or other suitable active devices, configured to execute at least one function. In some embodiments, circuitry 104 includes passive circuitry, such as resistors, capacitors or other suitable passive devices. In some embodiments, at least a portion of circuitry 104 is formed in a region of substrate 102. In some embodiments, circuitry 104 includes an interconnect structure.

Dielectric layer 106 is above circuitry 104 and is configured to help insulate inductor 110 from the circuitry. In some embodiments, dielectric layer 106 includes silicon oxide, silicon carbide, silicon nitride, silicon oxynitride, or another suitable dielectric material. In some embodiments, dielectric layer 106 is a same material as a dielectric material in the interconnect structure of circuitry 104. In some embodiments, dielectric layer 106 is a different material from the dielectric material in the interconnect structure of circuitry 104. In some embodiments, dielectric layer 106 is a single layer. In some embodiments, dielectric layer 106 is a multilayer structure.

Inductor 110 is at least partially over dielectric layer 106. In some embodiments, inductor 110 includes a single layer over a top surface of dielectric layer 106. In some embodiments, inductor 110 includes multiple layers and at least one of the layers is within dielectric layer 106. The multiple layers of inductor 110 are electrically connected by vias, line plugs, or other suitable connective elements.

Inductor shielding structure 120 is configured to reduce coupling between circuitry 104 and inductor 110. A distance D between inductor 110 and inductor shielding structure 120 depends on a technology node of integrated circuit 100 and on system specifications in frequency ranges. In some embodiments, distance D ranges from about 10 microns (μm) to about 200 μm. In some embodiments, distance D ranges from about 1 microns (μm) to about 10 μm. In some embodiments, distance D ranges from about 0.5 μm to about 1 μm. In some embodiments, distance D ranges from about 0.1 μm to about 0.5 μm If the distance D is too small an ability of inductor shielding structure 120 to reduce coupling between inductor 110 and circuitry 104 is reduced, in some instances. If the distance D is too great a size of integrated circuit 100 is increased without significant impact on functionality of the integrated circuit, in some instances. Inductor shielding structure 120 includes an interlaced structure of first conductive layer 120a and second conductive layer 120b. The interlaced structure of inductor shielding structure 120 obscures circuitry 104 from inductor 110 in a straight line extending perpendicular to the top surface of substrate 102.

First conductive layer 120a includes a plurality of parallel conductive lines extending in the first direction. Second conductive layer 120b also includes a plurality of parallel conductive lines extending in the first direction. A pitch or spacing between conductive lines of first conductive layer 120a is less than a width of conductive lines of second conductive layer 120b. Similarly, a pitch or spacing between conductive lines of second conductive layer 120b is less than a width of conductive lines of first conductive layer 120a. In some embodiments, the width of conductive lines of first conductive layer 120a is equal to the width of conductive lines of second conductive layer 120b. In some embodiments, the width of conductive lines of first conductive layer 120a is different from the width of conductive lines of second conductive layer 120b. In some embodiments, the pitch or spacing between conductive lines of first conductive layer 120a is equal to the pitch or spacing between conductive lines of second conductive layer 120b. In some embodiments, the pitch or spacing between conductive lines of first conductive layer 120a is different from the pitch or spacing between conductive lines of second conductive layer 120b.

In some embodiments, first conductive layer 120a is electrically connected to second conductive layer 120b by vias, line plugs or other suitable connective elements. In some embodiments, first conductive layer 120a is electrically disconnected from second conductive layer 120b. In some embodiments, at least one of first conductive layer 120a or second conductive layer 120b is connected to the reference voltage. In some embodiments, at least one of first conductive layer 120a or second conductive layer 120b is electrically floating.

In some embodiments, both first conductive layer 120a and second conductive layer 120b are in dielectric layer 106.

In some embodiments, second conductive layer 120b is in dielectric layer 106 and first conductive layer is in an interconnect structure of circuitry 104. In some embodiments, both first conductive layer 120a and second conductive layer 120b are in an interconnect structure of circuitry 104.

FIG. 1C is a cross-sectional view of integrated circuit 100 including inductor shielding structure 120 in accordance with some embodiments. FIG. 1C is a cross-sectional view in a central region of inductor 110 where no conductive elements of the inductor are above circuitry 104. Inductor shielding structure 120 is continuous across integrated circuit 100 despite the lack of conductive elements of inductor 110 directly above portions of the inductor shielding structure. In some embodiments, inductor shielding structure 120 is discontinuous in the central region of inductor 110 and an opening in the inductor shielding structure exposes a portion of circuitry 104.

FIG. 1D is a perspective view of integrated circuit 100 including inductor shielding structure 120 in accordance with some embodiments. FIG. 1D includes both first conductive layer 120a and second conductive layer 120b in dielectric layer 106. FIG. 1D also includes a multi-layer inductor 110 wherein the layers of the inductor are connected by vias 115.

FIG. 2A is a top view of an integrated circuit 200 including an inductor shielding structure 220 in accordance with some embodiments. Integrated circuit 200 includes an inductor 210 over an inductor shielding structure 220. Inductor shielding structure 220 extends under conductive regions of inductor 210 as well as under a central region of the inductor. Inductor 210 is the same as inductor 110 (FIG. 1A).

Inductor shielding structure 220 is configured to reduce coupling between inductor 210 and circuitry within integrated circuit 200. Inductor shielding structure 220 is similar to inductor shielding structure 120 (FIG. 1A). In comparison with inductor shielding structure 120, inductor shielding structure 220 has a perpendicular arrangement.

FIG. 2B is a cross-sectional view of integrated circuit 200 including inductor shielding structure 220 in accordance with some embodiments. FIG. 2B is a cross-sectional view of integrated circuit including a conductive region of inductor 210. Integrated circuit 200 is similar to integrated circuit 100 (FIG. 1B). Same elements have a same reference number increased by 100. In comparison with integrated circuit 100, the perpendicular structure of inductor shielding structure 220 exposes portions of circuitry 204 to inductor 210 in a straight line extending perpendicular to the top surface of substrate 202.

Inductor shielding structure 220 is configured to reduce coupling between circuitry 204 and inductor 210. First conductive layer 220a includes a plurality of parallel conductive lines extending in a first direction parallel to the top surface of substrate 202. Second conductive layer 220b includes a plurality of conductive lines extending in a second direction parallel to the top surface of substrate 202 and perpendicular to the first direction.

In some embodiments, a pitch between conductive lines of first conductive layer 220a is less than a width of conductive lines of second conductive layer 220b. In some embodiments, the pitch between conductive lines of first conductive layer 220a is equal to or greater than the width of conductive lines of second conductive layer 220b. In some embodiments, a pitch between conductive lines of second conductive layer 220b is less than a width of conductive lines of first conductive layer 220a. In some embodiments, the pitch between conductive lines of second conductive layer 220b is equal to or greater than the width of conductive lines of first conductive layer 220a. In some embodiments, the pitch between conductive lines of first conductive layer 220a is equal to the pitch between conductive lines of second conductive layer 220b. In some embodiments, the pitch between conductive lines of first conductive layer 220a is different from the pitch between conductive lines of second conductive layer 220b.

FIG. 2C is a cross-sectional view of integrated circuit 200 including inductor shielding structure 220 in accordance with some embodiments. FIG. 2C is a cross-sectional view in a central region of inductor 210 where no conductive elements of the inductor are above circuitry 204. Inductor shielding structure 220 is continuous across integrated circuit 200 despite the lack of conductive elements of inductor 210 directly above portions of the inductor shielding structure. In some embodiments, inductor shielding structure 220 is discontinuous in the central region of inductor 210 and an opening in the inductor shielding structure exposes a portion of circuitry 204.

FIG. 2D is a perspective view of integrated circuit 200 including inductor shielding structure 220 in accordance with some embodiments. FIG. 2D includes both first conductive layer 220a and second conductive layer 220b in dielectric layer 206. FIG. 2D also includes a multi-layer inductor 210 wherein the layers of the inductor are connected by vias 215.

FIG. 3 is a top view of an integrated circuit 300 including an inductor shielding structure 320 in accordance with some embodiments. Integrated circuit 300 is similar to integrated circuit 100. Integrated circuit 300 includes an inductor 310. Inductor 310 is the same as inductor 110 (FIG. 1A). Inductor shielding structure 320 is between inductor 310 and circuitry (not shown in FIG. 3). Inductor shielding structure 320 has a perpendicular arrangement. In some embodiments, inductor shielding structure 320 has an interlaced arrangement. Inductor shielding structure 320 includes a first portion 325 in areas spaced from portions of inductor 310 in a direction parallel to a top surface of a substrate (not shown in FIG. 3). Inductor shielding structure 320 includes a second portion 330 beneath inductor 310.

First portion 325 includes a first conductive layer 325a having a plurality of parallel conductive lines extending in a first direction parallel to the top surface of the substrate. First portion 325 also includes a second conductive layer 325b having a plurality of conductive lines extending in a second direction parallel to the top surface of the substrate and perpendicular to the first direction. In some embodiments, conductive lines of second conductive layer 325b extend in the first direction in an interlaced arrangement. First portion 325 extends under corner sections 310a and port sections 310b of inductor 310.

Second portion 330 extends under straight regions 310c of inductor 310 between adjacent corner regions 310a of the inductor and between the corner region 310a and an adjacent port region 310b of the inductor. Second portion 330 includes a first conductive layer 330a having at least one conductive line extending parallel to conductive liens of first conductive layer 325a. Second portion 330 also includes a second conductive layer 330b having a plurality of parallel conductive lines extending perpendicular to the at least one conductive line of first conductive layer 330a in a perpendicular arrangement. In some embodiments, the conductive lines of second conductive layer 330b extend parallel to the at least one conductive line of first conductive layer 330a in an interlaced arrangement.

Edges of second portion 330 extend beyond edges of inductor 310 when viewed in a direction perpendicular to the top surface of the substrate. In some embodiments, a ratio of a width of second portion 330 to a width of straight regions 310c ranges from about 1.0 to about 1.5. In some embodiments, a ratio of a width of second portion 330 to a width of straight regions 310c ranges from about 1.0 to about 1.25. In some embodiments, a ratio of a width of second portion 330 to a width of straight regions 310c ranges from about 0.8 to about 1.25 If the ratio of the width of second portion 330 to the width of straight regions 310c is too small, an ability of the second portion to reduce coupling between inductor 310 and circuitry is hampered, in some instances. If the ratio of the width of second region 330 to the width of straight regions 310c, difficulty of manufacturing integrated circuit 300 increases because spacing between adjacent second portions 330 is reduced.

A width of the at least one conductive line of first conductive layer 330a is less than the width of straight regions 310c. In some embodiments, the width of the at least one conductive line of first conductive layer 330a is equal to or greater than the width of straight regions 310c.

The width of the at least one conductive line of first conductive layer 330a is greater than a width of conductive lines of first conductive layer 325a. A width of the conductive lines of second conductive layer 330b is greater than a width of the conductive lines of second conductive layer 325b. In some embodiments, the width of the conductive liens of second conductive layer 330b is equal to or less than the width of the conductive lines of second conductive layer 325b.

In some embodiments in which includes a plurality of conductive lines in first conductive layer 330a, a pitch between the conductive lines of first conductive layer 330a is larger than a pitch between the conductive lines of first conductive layer 325a. In some embodiments in which includes a plurality of conductive lines in first conductive layer 330a, the pitch between the conductive lines of first conductive layer 330a is less than or equal to the pitch between the conductive lines of first conductive layer 325a. In some embodiments, a pitch between the conductive lines of second conductive layer 330b is larger than a pitch between the conductive lines of second conductive layer 325b. In some embodiments, the pitch between the conductive lines of second conductive layer 330b is equal to or less than the pitch between the conductive lines of second conductive layer 325b.

Second portion 330 is spaced from first portion 325 by a gap 340. In some embodiments, a width of gap 340 is a smallest spacing distance able to be manufactured, i.e., a critical dimension. In some embodiments, gap 340 is omitted and second portion 330 abuts first portion 325. In some embodiments, first portion 325 is discontinuous in a central region of inductor 310 and a portion of the circuitry underlying inductor shielding structure 320 is exposed.

FIG. 4A is a top view of a portion of an integrated circuit 400 including an inductor shielding structure 420 in accordance with some embodiments. Integrated circuit 400 is similar to integrated circuit 100 (FIG. 1A). Same elements have a same reference number increased by 300. Integrated circuit 400 includes inductor 410 which is the same as inductor 110. Inductor shielding structure 420 includes a corner region 425 underneath a corner of inductor 410. Inductor shielding structure 420 also includes a straight region 430 underneath a straight region of inductor 410. Inductor shielding structure 420 is discontinuous in a central region of inductor 410 and an opening exposes circuitry (not shown in FIG. 4A) underlying the inductor shielding structure.

Corner region 425 has a different layout of conductive lines in comparison with straight region 430. In some embodiments, a pitch between conductive lines of corner region 425 is equal to a pitch between conductive lines of straight region 430. In some embodiments, the pitch between conductive lines of corner region 425 is less than the pitch between conductive lines of straight region 430. In some embodiments, straight region 430 is the same as second portion 330 (FIG. 3). A width of inductor shielding structure 420 is at least twice a width of inductor 410. In some embodiments, a ratio of the width of inductor shielding structure 420 to the width of inductor 410 ranges from about 2.0 to about 3.0. In some embodiments, a ratio of the width of inductor shielding structure 420 to the width of inductor 410 ranges from about 2.0 to about 2.5. In some embodiments, a ratio of the width of inductor shielding structure 420 to the width of inductor 410 ranges from about 2.3 to about 3.0. In some embodiments, a ratio of the width of inductor shielding structure 420 to the width of inductor 410 ranges from about 1.8 to about 3.0.

FIG. 4B is a schematic view of corner region 425 of inductor shielding structure 420 in accordance with some embodiments. Corner region 425 includes a first conductive layer similar to first conductive layer 325a (FIG. 3). In comparison with first conductive layer 325, the first conductive layer of corner region 425 includes a continuous conductive line 425a' and a plurality of connecting elements 425a". Continuous conductive line 425a' is parallel to each of the plurality of connecting elements 425a". A distance between continuous conductive line 425a' and a connecting element 425a" closest to straight region 430 is greater than a distance between continuous conductive line 425a' and a connecting element 425a" spaced from straight region 430. A distance between continuous conductive line 425a' and a connecting element 425a" farthest from straight region 430 is less than a distance between continuous conductive line 425a' and a connecting element 425a" closer to straight region 430.

Corner region 425 further includes a second conductive layer similar to second conductive layer 325b (FIG. 3). In comparison with second conductive layer 325b, the second conductive layer of corner region 425 includes a first conductive line 425b' extending from continuous conductive line 425a' to one connecting element 425a". First conductive line 425b' is above or below continuous conductive line 425a' and the connecting element 425a". In some embodiments, first conductive line 425b' is electrically connected to continuous conductive line 425a' and the connecting element 425a". The second conductive layer of corner region 425 also includes a second conductive line 425b" extending from the same connecting element 425a" connected to first conducting line 425b'. In some embodiments, second conductive line 425b" is electrically connected to connecting element 425b". Second conductive line 425b" is in a same plane as first conductive line 425b'. Second conductive line 425b" extends less than an entire way from the connective element 425a" to continuous conductive line 425a', i.e., a length of second conductive line 425b" is less than a length of first conductive line 425b'. Each connecting element 425a" includes similar first conductive line and second conductive line. A length of the first conductive line is equal to or greater than a distance between continuous conductive line 425a' and a corresponding connecting element 425a". A length of the second conductive line is less than the distance between continuous conductive line 425a' and the corresponding connecting element 425a".

FIG. 4C is a schematic view of straight region 430 of inductor shielding structure 420 in accordance with some embodiments. Straight region 430 includes a first conductive layer similar to first conductive layer 330a (FIG. 3). In comparison with first conductive layer 330a, the first conductive layer of straight region 430 includes a continuous conductive line 430a' and a plurality of connecting elements 430a". Continuous conductive line 430a' is parallel to each of the plurality of connecting elements 430a". A distance between continuous conductive line 430a' and each connecting element 430a" is constant for each connecting element 430a".

Straight region 430 further includes a second conductive layer similar to second conductive layer 330b (FIG. 3). In comparison with second conductive layer 330b, the second conductive layer of straight region 430 includes a first conductive line 430b' extending from continuous conductive line 430a' to one connecting element 430a". First conductive line 430b' is above or below continuous conductive line 430a' and the connecting element 430a". In some embodiments, first conductive line 430b' is electrically connected to continuous conductive line 430a' and the connecting element 430a". The second conductive layer of straight region 430 also includes a second conductive line 430b" extending from the same connecting element 430a" connected to first conducting line 430b'. In some embodiments, second conductive line 430b" is electrically connected to connecting element 430a". Second conductive line 430b" is in a same plane as first conductive line 430b'. Second conductive line 430b" extends less than an entire way from the connective element 430a" to continuous conductive line 430a', i.e., a length of second conductive line 430b" is less than a length of first conductive line 430b'. Each connecting element 430a" includes similar first conductive line and second conductive line. A length of the first conductive line is equal to or greater than a distance between continuous conductive line 430a' and a corresponding connecting element 430a". A length of the second conductive line is less than the distance between continuous conductive line 430a' and the corresponding connecting element 430a".

FIG. 4D is a schematic view of straight region 430 of inductor shielding structure 420 in accordance with some embodiments. In comparison with FIG. 4C, straight region 430 in FIG. 4D includes a second continuous conductive line and a second plurality of connecting elements. Straight region 430 in FIG. 4D also includes an additional first conductive line and an additional second conductive line extending from a corresponding connecting element. The additional first conductive line and the additional second conductive line connected to the second plurality of connecting elements are arranged in an interdigitated arrangement with the first conductive line and the second conductive line connected to the first plurality of connecting elements from FIG. 4C.

Straight region 430 in FIG. 4C helps to reduce coupling between inductor 410 and circuitry in integrated circuit 400 in comparison with straight region 430 in FIG. 4B due to the increased physical shielding. However, straight region 430 in FIG. 4C uses more material and is more difficult to manufacture in comparison with straight region 430 in FIG. 4B.

FIG. 4E is a schematic view of straight region 430 of inductor shielding structure 420 in accordance with some embodiments. In comparison with FIG. 4D, straight region 430 in FIG. 4E includes several connective elements 440 electrically connected to corresponding conductive lines the second conductive layer of straight region 430. Connective elements 440 are in a same plane as second conductive layer of straight region 430.

Straight region 430 in FIG. 4D helps to reduce coupling between inductor 410 and circuitry in integrated circuit 400 in comparison with straight region 430 in FIGS. 4B and 4C due to the increased physical shielding. However, straight region 430 in FIG. 4D uses more material and is more difficult to manufacture in comparison with straight region 430 in FIGS. 4B and 4C.

Figure 5A:
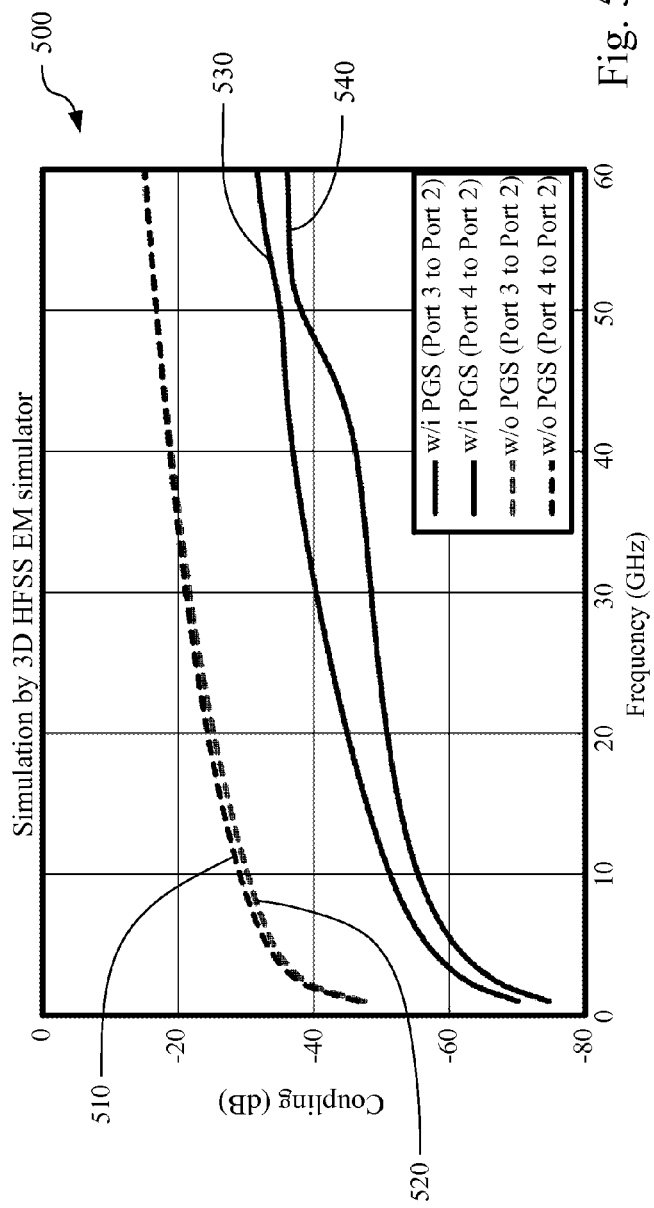
FIG. 5A is a graph of a coupling efficiency of a transmission line with an inductor in accordance with some embodiments.
Figure 5B:
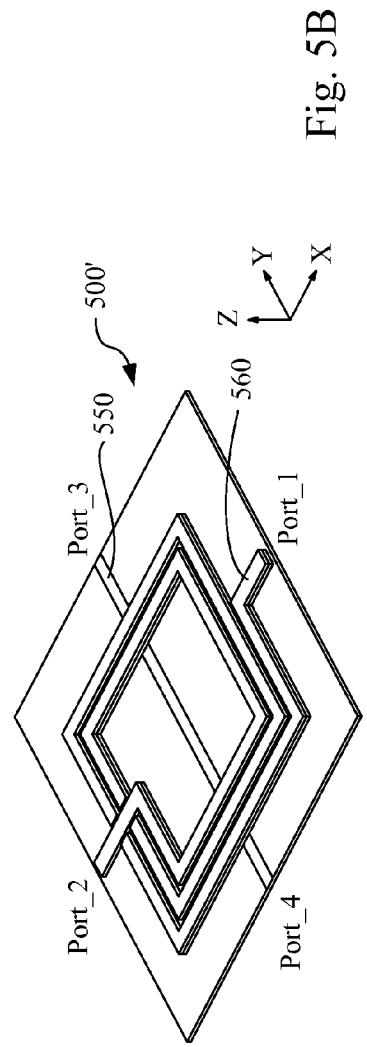
FIG. 5B is a schematic view of a testing arrangement for determining a coupling efficiency of a transmission line in accordance with some embodiments.

FIG. 5A is a graph 500 of a coupling efficiency of a transmission line with an inductor in accordance with some embodiments. FIG. 5B is a schematic view of a testing arrangement 500' for determining a coupling efficiency of a transmission line 550 and an inductor 560 for graph 500 in accordance with some embodiments. In testing arrangement 500' transmission line 550 extends under a central portion of inductor 560. During testing a signal is passed through inductor 560 from port 1 to port 2.

Graph 500 includes a plot 510 which indicates a coupling between transmission line 550 and inductor 560 measured at port 4 and port 2 of testing arrangement 500' without the use of an inductor shielding structure. Graph 500 includes a plot 520 which indicates a coupling between transmission line 550 and inductor 560 measured at port 3 and port 2 of testing arrangement 500' without the use of an inductor shielding structure. Graph 500 includes a plot 530 which indicates a coupling between transmission line 550 and inductor 560 measured at port 4 and port 2 of testing arrangement 500' including an inductor shielding structure, e.g., inductor shielding structure 120 (FIG. 1A), inductor shielding structure 220 (FIG. 2A), inductor shielding structure 320 (FIG. 3), or inductor shielding structure 420 (FIG. 4A). Graph 500 includes a plot 540 which indicates a coupling between transmission line 550 and inductor 560 measured at port 3 and port 2 of testing arrangement 500' including the inductor shielding structure. Graph 500 indicates that coupling between inductor 560 and transmission line 550 is less than about 40 decibels (dB) at a test signal frequency below 30 gigahertz (GHz).

Figure 6A:
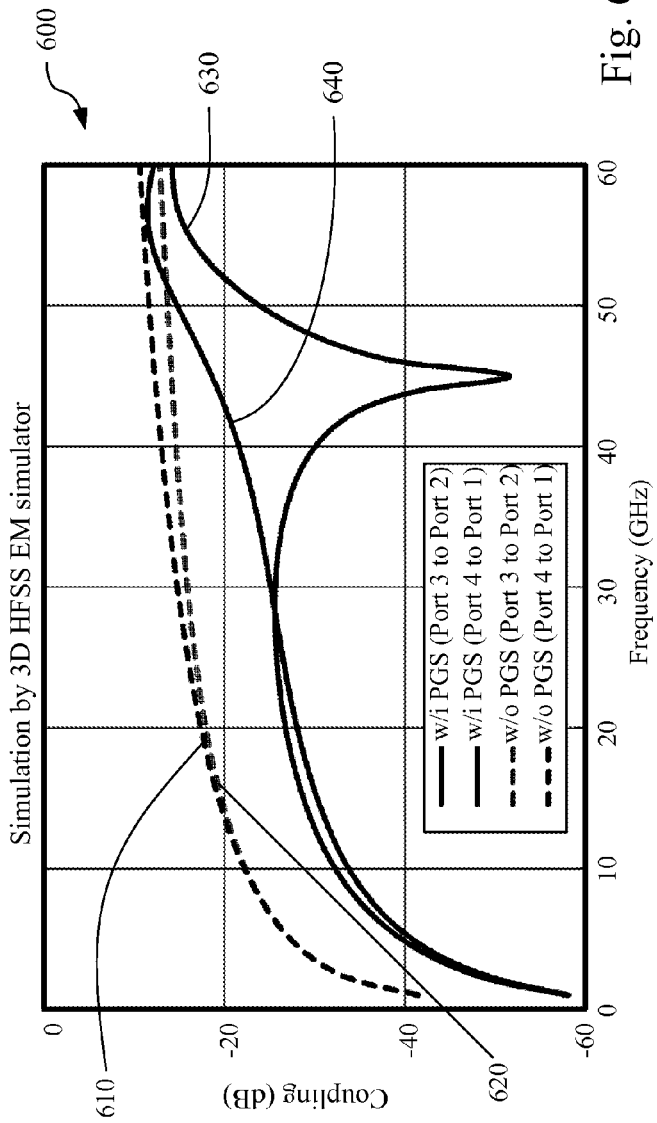
FIG. 6A is a graph of a coupling efficiency of a transmission line with an inductor in accordance with some embodiments.
Figure 6B:
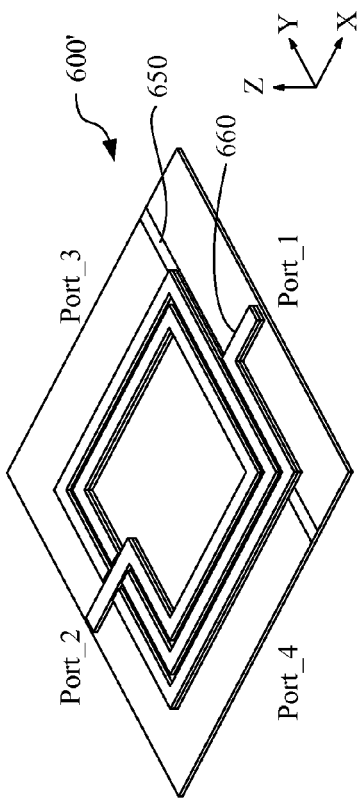
FIG. 6B is a schematic view of a testing arrangement for determining a coupling efficiency of a transmission line in accordance with some embodiments.

FIG. 6A is a graph 600 of a coupling efficiency of a transmission line with an inductor in accordance with some embodiments. FIG. 6B is a schematic view of a testing arrangement 600' for determining a coupling efficiency of a transmission line 650 and an inductor 660 for graph 600 in accordance with some embodiments. In testing arrangement 600' transmission line 650 extends under a conductive portion of inductor 660. During testing a signal is passed through inductor 660 from port 1 to port 2.

Graph 600 includes a plot 610 which indicates a coupling between transmission line 650 and inductor 660 measured at port 4 and port 1 of testing arrangement 660' without the use of an inductor shielding structure. Graph 600 includes a plot 620 which indicates a coupling between transmission line 650 and inductor 660 measured at port 3 and port 2 of testing arrangement 600' without the use of an inductor shielding structure. Graph 600 includes a plot 630 which indicates a coupling between transmission line 650 and inductor 660 measured at port 4 and port 1 of testing arrangement 600' including an inductor shielding structure, e.g., inductor shielding structure 120 (FIG. 1A), inductor shielding structure 220 (FIG. 2A), inductor shielding structure 320 (FIG. 3), or inductor shielding structure 420 (FIG. 4A). Graph 600 includes a plot 640 which indicates a coupling between transmission line 650 and inductor 660 measured at port 3 and port 2 of testing arrangement 600' including the inductor shielding structure. Graph 600 indicates that coupling between inductor 660 and transmission line 650 is less than about 32 dB at a test signal frequency below 10 GHz.

Figure 7:
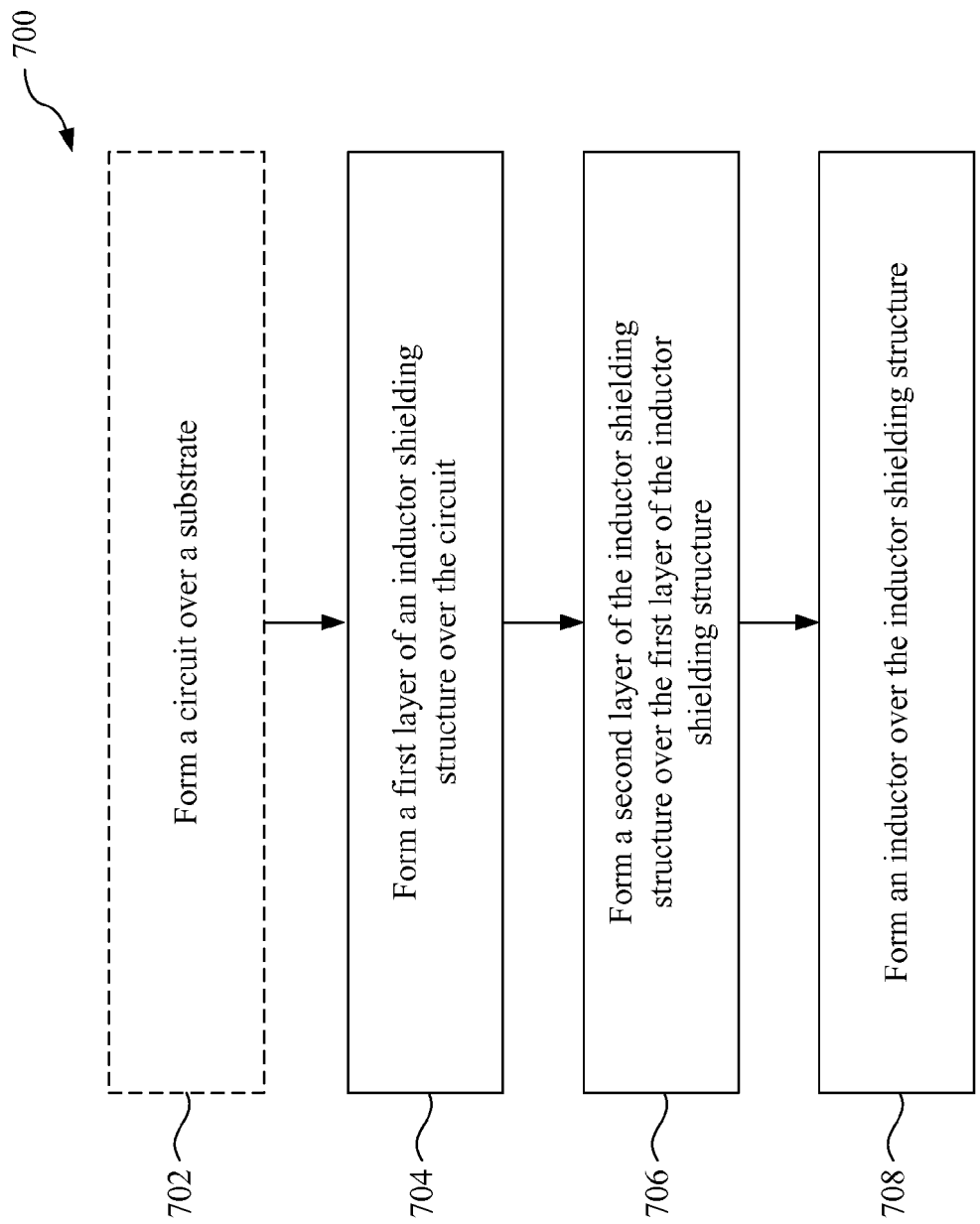
FIG. 7 is a flowchart of a method of making an integrated circuit including an inductor shielding structure in accordance with some embodiments.

FIG. 7 is a flowchart of a method 700 of making an integrated circuit including an inductor shielding structure in accordance with some embodiments. In operation 702, a circuit is formed over a substrate. In some embodiments, the circuit includes active devices. In some embodiments, the circuit includes passive devices. In some embodiments, the circuit is circuitry 104 (FIG. 1B) or circuitry 204 (FIG. 2B). In some embodiments, the circuit is formed using a series of doping processes, deposition processes, etching processes, or other suitable processes.

In some embodiments, operation 702 is omitted. Operation 702 is omitted when a pre-formed circuit is received by a manufacturer of the inductor shielding structure, in some embodiments. Operation 702 is omitted when the circuit is formed in a separate process, in some embodiments.

In operation 704 a first layer of the inductor shielding structure is formed over the circuit. In some embodiments, the first layer of the inductor shielding structure is formed by etching openings in an interconnect of the circuit and forming a conductive material in the openings. In some embodiments, the first layer of the inductor shielding structure is formed by forming a layer of conductive material over the interconnect of the circuit. In some embodiments, a pitch between conductive lines in the first layer of the inductor shielding structure is constant. In some embodiments, the first layer of the inductor shielding structure includes at least one portion having a first pitch and at least one portion having a second pitch different from the first pitch. In some embodiments, a width of conductive lines in the first layer of the inductor shielding structure is constant. In some embodiments, the first layer of the inductor shielding structure includes at least one portion having conductive lines having a first width and at least one portion having conductive lines having a second width different from the first width. In some embodiments, the first layer of the inductor shielding structure is connected to a reference voltage, e.g., a ground voltage. In some embodiments, the first layer of the inductor shielding structure is electrically floated.

In operation 706 a second layer of the inductor shielding structure is formed over the first layer of the inductor shielding structure. In some embodiments, the second layer of the inductor shielding structure is formed by etching openings in the interconnect of the circuit and forming a conductive material in the openings. In some embodiments, the second layer of the inductor shielding structure is formed by forming a layer of conductive material over the interconnect of the circuit. In some embodiments, a pitch between conductive lines in the second layer of the inductor shielding structure is constant. In some embodiments, the second layer of the inductor shielding structure includes at least one portion having a first pitch and at least one portion having a second pitch different from the first pitch. In some embodiments, a width of conductive lines in the second layer of the inductor shielding structure is constant. In some embodiments, the second layer of the inductor shielding structure includes at least one portion having conductive lines having a first width and at least one portion having conductive lines having a second width different from the first width. In some embodiments, the pitch of conductive lines in the second layer of the inductor shielding structure is equal to the pitch of conductive lines in the first layer of the inductor shielding structure. In some embodiments, at least one pitch in the second layer of the inductor shielding structure is different from at least one pitch in the first layer of the inductor shielding structure. In some embodiments, the width of conductive lines in the second layer of the inductor shielding structure is equal to the width of conductive lines in the first layer of the inductor shielding structure. In some embodiments, at least one conductive line width in the second layer of the inductor shielding structure is different from at least one conductive line width in the first layer of the inductor shielding structure. In some embodiments, the second layer of the inductor shielding structure is connected to the reference voltage. In some embodiments, the second layer of the inductor shielding structure is electrically floated.

Following operation 706, the inductor shielding structure is similar to inductor shielding structure 120 (FIG. 1A), inductor shielding structure 220 (FIG. 2A), inductor shielding structure 320 (FIG. 3), or inductor shielding structure 420 (FIG. 4A).

In operation 708, an inductor is formed over the inductor shielding structure. In some embodiments, the inductor is formed over a dielectric layer configured to separate the inductor from the inductor shielding structure. In some embodiments, the inductor is completely over the dielectric layer. In some embodiments, at least a portion of the inductor is formed within the dielectric layer. In some embodiments, the inductor includes a single conductive layer. In some embodiments, the inductor is a multi-layered conductive structure.

In some embodiments, method 700 includes additional operations. In some embodiments, an order of operation of method 700 is changed.

One aspect of this description relates to an inductor shielding structure. The inductor shielding structure includes a first conductive layer including a plurality of first conductive lines having a first width and a plurality of second conductive lines having a second width. The inductor shielding structure further includes a second conductive layer over the first conductive layer. The second conductive layer includes at least one third conductive line having a third width and a plurality of fourth conductive lines having a fourth width. Each conductive line of the at least one third conductive line is parallel to each conductive line of the plurality of first conductive lines. Each conductive line of the plurality of fourth conductive lines is parallel to each conductive line of the plurality of second conductive lines. The first width is different from the second width, or the third width is different from the fourth width.

Another aspect of this description relates to an integrated circuit. The integrated circuit includes a circuit over a substrate. The integrated circuit further includes an inductor over the circuit, wherein the inductor includes a straight region and a corner region. The integrated circuit further includes an inductor shielding structure between the inductor and the circuit. The inductor shielding structure includes a first conductive layer including a plurality of first conductive lines. The plurality of first conductive lines extends parallel to a top surface of the substrate. The inductor shielding structure further includes a second conductive layer including a plurality of second conductive lines. The plurality of second conductive lines extends parallel to the top surface of the substrate. The second conductive layer is between the first conductive layer and the inductor.

Still another aspect of this description relates to a method of making an integrated circuit. The method includes forming an inductor over a circuit. The inductor includes a straight region and a corner region. The circuit is over a substrate. The method further includes forming an inductor shielding structure between the inductor and the circuit. Forming the inductor shielding structure includes forming a first conductive layer including a plurality of first conductive lines, wherein the plurality of first conductive lines extends parallel to a top surface of the substrate. Forming the inductor shielding structure further includes forming a second conductive layer including a plurality of second conductive lines. The plurality of second conductive lines extends parallel to the top surface of the substrate, and the second conductive layer is between the first conductive layer and the inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inductor shielding structure comprising:
   a first conductive layer including a plurality of first conductive lines having a first width and a plurality of second conductive lines having a second width; and
   a second conductive layer over the first conductive layer, wherein the second conductive layer includes at least one third conductive line having a third width and a plurality of fourth conductive lines having a fourth width, wherein each conductive line of the at least one third conductive line is parallel to each conductive line of the plurality of first conductive lines, and each conductive line of the plurality of fourth conductive lines is parallel to each conductive line of the plurality of second conductive lines, and
   wherein the first width is different from the second width, or the third width is different from the fourth width.

2. The inductor shielding structure of claim 1, wherein the first width is different from the second width, and the third width is different from the fourth width.

3. The inductor shielding structure of claim 1, wherein the at least one third conductive line is a plurality of third conductive lines, and a pitch between conductive lines of the plurality of third conductive lines is different from a pitch between conductive lines of the plurality of first conductive lines.

4. The inductor shielding structure of claim 1, wherein a pitch between conductive lines of the plurality of fourth conductive lines is different from a pitch between conductive lines of the plurality of second conductive lines.

5. The inductor shielding structure of claim 1, wherein the at least one third conductive line and the plurality of fourth conductive lines are in an interlaced arrangement.

6. The inductor shielding structure of claim 1, wherein the at least one third conductive line and the plurality of fourth conductive lines are in a perpendicular arrangement.

7. The inductor shielding structure of claim 1, wherein the at least one third conductive line is spaced from a closest conductive line of the plurality of first conductive lines by a gap.

8. An integrated circuit comprising:
   a circuit over a substrate;
   an inductor over the circuit, wherein the inductor includes a straight region and a corner region; and
   an inductor shielding structure between the inductor and the circuit, wherein the inductor shielding structure comprises:
      a first conductive layer comprising a plurality of first conductive lines, wherein the plurality of first conductive lines extend parallel to a top surface of the substrate; and
      a second conductive layer comprising a plurality of second conductive lines, wherein the plurality of second conductive lines extend parallel to the top surface of the substrate, and the second conductive layer is between the first conductive layer and the inductor.

9. The integrated circuit of claim 8, wherein the inductor shielding structure has an interlaced arrangement.

10. The integrated circuit of claim 8, wherein the inductor shielding structure has a perpendicular arrangement.

11. The integrated circuit of claim 8, wherein the inductor shielding structure is connected to a reference voltage.

12. The integrated circuit of claim 8, wherein the inductor shielding structure is electrically floating.

13. The integrated circuit of claim 8, wherein the first conductive layer further comprises at least one third conductive line having a width greater than a width of each conductive line of the plurality of first conductive line.

14. The integrated circuit of claim 13, wherein the width of the at least one conductive line is greater than a width of the straight region of the inductor.

15. The integrated circuit of claim 8, wherein the inductor shielding structure further comprises:
    a first portion including the plurality of first conductive lines and the plurality of second conductive lines, wherein the first portion is under the corner region of the inductor; and
    a second portion comprising at least one third conductive line extending parallel to the plurality of first conductive lines and a plurality of fourth conductive lines extending parallel to the plurality of second conductive lines, wherein the second portion is under the straight region of the inductor.

16. The integrated circuit of claim 15, wherein a width of at least one conductive line of the plurality of fourth conductive lines is greater than a width of at least one conductive line of the plurality of second conductive lines.

17. The integrated circuit of claim 15, wherein a pitch between conductive lines of the plurality of fourth conductive lines is different from a pitch between conductive lines of the plurality of second conductive lines.

18. The integrated circuit of claim 8, wherein the first conductive layer is under the corner region of the inductor, and the plurality of first conductive lines comprises:
    a continuous conductive line;
    a first connecting element spaced from the continuous conductive line by a first distance; and
    a second connecting element spaced from the continuous conductive line by a second distance different from the first distance.

19. The integrated circuit of claim 18, wherein the first connecting element is closer to the straight region of the inductor than the second connecting element, and the first distance is greater than the second distance.

20. An integrated circuit comprising:
an inductor over a substrate; and
an inductor shielding structure between the inductor and the substrate, wherein the inductor shielding structure comprises:
  a first conductive layer including a plurality of first conductive lines having a first width and a plurality of second conductive lines having a second width; and
  a second conductive layer over the first conductive layer, wherein the second conductive layer includes at least one third conductive line having a third width and a plurality of fourth conductive lines having a fourth width, wherein each conductive line of the at least one third conductive line is parallel to each conductive line of the plurality of first conductive lines, and each conductive line of the plurality of fourth conductive lines is parallel to each conductive line of the plurality of second conductive lines,
wherein the plurality of first conductive lines are under a corner portion of the inductor, and the plurality of second conductive lines are under a non-corner portion of the inductor.

* * * * *